United States Patent
Goetz

(10) Patent No.: US 10,473,728 B2
(45) Date of Patent: Nov. 12, 2019

(54) ELECTRONIC CIRCUIT FOR EASIER OPERATION OF MULTILEVEL CONVERTERS

(71) Applicant: Dr. Ing. h.c. F. Porsche Aktiengesellschaft, Stuttgart (DE)

(72) Inventor: Stefan Goetz, Forstern (DE)

(73) Assignee: Dr. Ing. h.c. F. Porsche Aktiengesellschaft (DE)

( * ) Notice: Subject to any disclaimer, the term of this patent is extended or adjusted under 35 U.S.C. 154(b) by 0 days.

(21) Appl. No.: 15/318,057

(22) PCT Filed: Jun. 3, 2015

(86) PCT No.: PCT/DE2015/000277
§ 371 (c)(1),
(2) Date: Jan. 18, 2017

(87) PCT Pub. No.: WO2015/188804
PCT Pub. Date: Dec. 17, 2015

(65) Prior Publication Data
US 2017/0123014 A1    May 4, 2017

(30) Foreign Application Priority Data
Jun. 13, 2014    (DE) .................... 20 2014 004 749 U

(51) Int. Cl.
*G01R 31/40*    (2014.01)
*H02M 7/483*    (2007.01)
*H02J 7/00*    (2006.01)

(52) U.S. Cl.
CPC ............ *G01R 31/40* (2013.01); *H02J 7/0024* (2013.01); *H02M 7/483* (2013.01); *H02M 2007/4835* (2013.01)

(58) Field of Classification Search
CPC ...................................................... G01R 31/40
See application file for complete search history.

(56) References Cited

U.S. PATENT DOCUMENTS

| 3,581,212 A | 5/1971 | McMurray |
| 7,269,037 B2 | 9/2007 | Marquardt |
| 9,467,065 B2* | 10/2016 | Levilly ................. H02M 7/537 |
| 9,496,799 B2 | 11/2016 | Goetz |
| 9,502,960 B2 | 11/2016 | Weyh |

(Continued)

FOREIGN PATENT DOCUMENTS

| DE | 102009057288 A1 | 6/2011 |
| DE | 102010008978 A1 | 8/2011 |

(Continued)

OTHER PUBLICATIONS

Chen et al., "A Multilevel Converter Topology with Fault-Tolerant Ability" (Year: 2005).*

(Continued)

*Primary Examiner* — Jermele M Hollington
*Assistant Examiner* — Feba Pothen
(74) *Attorney, Agent, or Firm* — RatnerPrestia

(57) ABSTRACT

Prior art electronic power supplies having distributed energy stores and/or the possibility to dynamically modify the connectivity of individual stores require complex monitoring of the input and output currents to and from the individual energy stores, often using a multitude of sensors, in order to allow for unrestricted operation. Examples of such power supplies include in particular modular multilevel converters and switched-capacitor circuits. The preen invention describes a possibility to determine the states of charge and energy levels of the energy stores using a small number of measuring systems.

11 Claims, 12 Drawing Sheets

(56) References Cited

U.S. PATENT DOCUMENTS

| | | | | |
|---|---|---|---|---|
| 2010/0321038 | A1* | 12/2010 | Dommaschk | H02M 7/483 324/658 |
| 2014/0049230 | A1 | 2/2014 | Weyh | |
| 2014/0232364 | A1* | 8/2014 | Thomas | H02M 7/483 323/271 |
| 2014/0312828 | A1* | 10/2014 | Vo | H01M 10/4257 320/103 |

FOREIGN PATENT DOCUMENTS

| | | |
|---|---|---|
| DE | 102010052934 A1 | 5/2012 |
| DE | 102011108920 A1 | 1/2013 |
| WO | 2012072168 A2 | 6/2012 |
| WO | 2012072197 A2 | 6/2012 |
| WO | 2013017186 A2 | 2/2013 |

OTHER PUBLICATIONS

International Search Report and Written Opinion of the International Searching Authority for International Application No. PCT/DE2015/000277, 6 pages.

Aengqujist et al., "Open-Loop Control of Modular Multilevel Converters Using Estimation of Stored Energy", IEEE Transactions on Industry Applictions, vol. 47, No. 6, Nov./Dec. 2011, pp. 2516-2524.

Peng et al., "Recent Advances in Multilevel Converter/Inverter Topologies and Applications", The 2010 International Power Electronics Conference, 2010, pp. 492-501.

Rodriquez et al., "A Multilevel Inverter Topology for Inductively Coupled Power Transfer", IEEE Transactions on Power Electronics, vol. 21, No. 5, Nov. 2006, pp. 1607-1617.

Seeman et al., "Analysis and Optimization of Switched-Capacitor DC-DC Converters", IEEE Transaactions on Power Electronics, vol. 23, No. 2, Mar. 2008, 11 pages.

Lesnicar et al., "An Innovative Modular Multilevel Converter Topology Suitable for a Wide Range, "IEEE Power Tech. Conference Proceedings, 2003, vol. 3, No. 6, 6 pages.

Goetz et al., Modular Multilevel Converter With Series and Parallel Module Connectivity: Topology and Control., IEEE Transactions on Power Electronics, vol. 30, No. 1, Jan. 2015, pp. 203-215.

Chinese Office Action for Chinese Application No. 2015800430290, dated Sep. 28, 2018—5 pages.

* cited by examiner

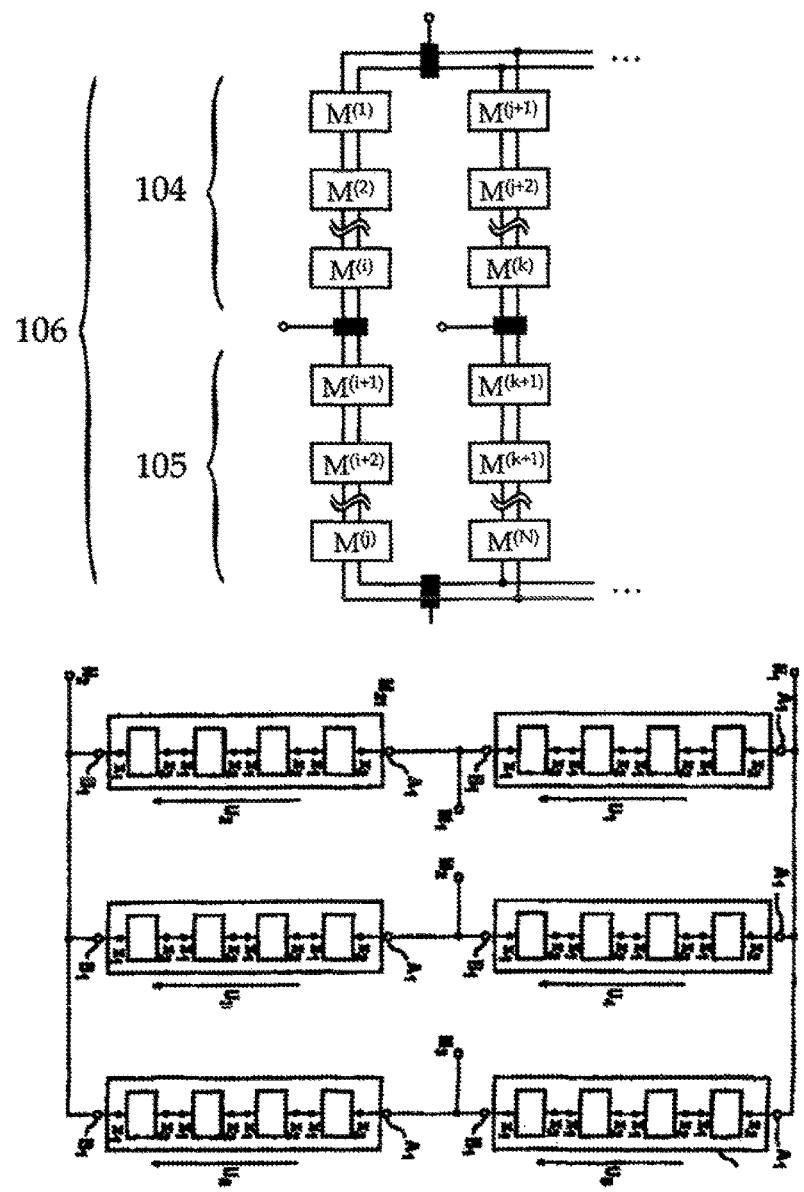
Fig. 1
PriorArt

ELECTRONIC CIRCUIT FOR EASIER OPERATION OF MULTILEVEL CONVERTERS

CROSS-REFERENCE TO RELATED APPLICATIONS

This U.S. national phase patent application claims priority to PCT International Patent Application No. PCT/DE2015/000277, filed Jun. 3, 2015, which claims priority to German Patent Application No. DE 20 2014 004 749.9, filed Jun. 13, 2014, the content of such applications being incorporated by reference herein in its entirety.

FIELD OF THE INVENTION

The present invention comprises an electronic circuit with an associated controller which can be used, for example, for efficient, power-electronic power supplies, electrical converters, electrical inverters and battery-integrated converters, or battery systems with the possibility of dynamically changing the connectivity of individual battery components (for example in a serial or parallel fashion).

BACKGROUND OF THE INVENTION

Examples of such power-electronic circuits are the modular multilevel convertor M2C (see U.S. Pat. No. 7,269,037; DE 101 03 031) or the modular multilevel parallel-serial convertor M2SPC (see WO 2012072197; DE 102010052934; WO 2012072168; WO 2012072197; EP 20110179321; DE 20101052934; WO 2013017186; DE 102011108920). In addition, what are referred to as switched-capacitor circuits meet the necessary preconditions for use together with the present invention, i.e. the use of a plurality of energy stores whose electrical connections to one another can be varied dynamically in order to exchange energy between the energy stores and/or to control electrical parameters (in particular the current and/or voltage) at terminals for external systems (for example energy grids, electrical consumers or sources). The invention is not necessarily tied to a specific convertor or type of module here.

The term module is used below to refer to any unit in a power-electronic circuit which has a plurality of electrical energy stores and respectively contains an energy store and at least one electronic switch which contributes to dynamically changing the electrical connection of the at least one energy store of the module to at least one energy store of another module. This changing of the electrical connection of the at least one energy store to at least one energy store of another module can for example also refer to the changeover from a virtual series connection of these energy stores to bypassing of one or more of these energy stores by conducting the current past the energy store without charging or to discharging it (referred to as the bypass state). Therefore, the term also refers to switched capacitor circuits. In the text which follows, all these circuits are referred to as converters. Different modules can be fabricated independently of one another, for example, on separate electronic units, for example electronic circuit boards, in order to use cost reduction effects in production owing to relatively high production numbers of similar units, and/or to use maintenance through the possibility of easily replacing potentially closed-off individual modules.

The switched state of a module refers to the way in which the switch or switches of the module are activated or deactivated in order to connect at least one electrical energy store of the module in an electrically conductive fashion to at least one electrical energy store of at least one other module in a different way, referred to as the connectivity, or explicitly not to connect it (open circuit or disconnected connection), in such a way that a plurality of modules together generate an electrical voltage. Examples of possible connectivities of electrical energy stores are, for example, a parallel connection and series connection, combinations of electrical energy stores as well as energy stores which are unconnected or connected only to one contact.

Exemplary elementary circuits from the prior art which can be a basis for the invention are the modular multilevel converter M2C (U.S. Pat. No. 7,269,037; DE 101 03 031), the modular multilevel converter M2SPC (WO 2012072197; DE 102010052934; WO 2012072168; WO 2012072197; EP 20110179321; DE 20101052934; WO 2013017186; DE 102011108920) as well as most of what are referred to as switched capacitor circuits (see, for example, [M. D. Seeman, S. R. Sanders (2008). Analysis and optimization of switched-capacitor dc-dc converters. IEEE Transactions on Power Conversion, 23(2): 841(ff)]), Modular multilevel converters such as the M2C or the M2SPC are based on the interconnection of modules with a generally significantly lower voltage than the entire output voltage of the modular converter which is formed therefrom. Depending on the type of converter, the corresponding module connection breaks up the overall voltage, overall current and necessary switching rate of the individual electronic switchers into small partial units, in contrast with a traditional converter with fewer than four levels (for example H-bridges). In the M2C, individual modules are composed, for example, of an energy store, for example a capacitor, and a plurality of electronic switchers which are arranged either in a half-bridge or in a full bridge. Each M2C module is therefore a dipole which can, for example, be connected in series and/or parallel with other modules, in order to form what is referred to as a macrotopology, i.e. a combination of modules for performing electrical converter tasks.

In this context, there are further derivations and developments such as those described, for example, in U.S. Ser. No. 13/990,463; U.S. Ser. No. 14/235,812; DE 10 2010 008978; DE 10 2009 057288; U.S. Pat. No. 3,581,212.

Such modules, referred to as microtopologles, can be linked to one another in different ways in what are referred to as macrotopologies. The macrotopology which occurs most frequently is the Marquardt topology (see U.S. Pat. No. 7,269,037; DE 102010052934), which is illustrated for the M2C and the M2SPC in FIG. 1. In this macrotopology, a plurality of phase modules or phase units, which are composed themselves of converter arms (the interconnection of at least two modules) exist which are connected to one another at the ends. In addition, there are numerous further variants for the connection of modules, in the simplest cases a simple chain of modules.

In virtually all macrotopologies, the smallest unit is what is referred to as the converter arm. It constitutes a line of at least two similar modules which are connected to one another. The similarity is already given by the fact that the adjacent modules have in common at least two common states (for example serial positive and bypass) and can be used with dynamic changes between them during operation.

Typical examples of switched capacitor circuits are voltage pumps in which electrical energy stores, for example capacitors, can change their connectivity from a (partial) series circuit to a (partial) parallel circuit and can therefore change their generated voltage. An example of this is the Marx converter, often referred to as a Marx generator [see Erwin Marx (1925). Erzeugung von verschiedenen Hochspannungsarten zu Versuchs-und Prüfzwecken [Generation of various types of high voltage for experimental and testing purposes]. *Elektrotech. Zeitschrift* (Electroengineering periodical)], and refinements thereof [for example J. Rodriguez, S. Leeb (2006). A multilevel inverter topology for inductively coupled power transfer. IEEE Transactions on Power Electronics, 21(6): 1607ff.; F. Peng, W. Qiang, D. Cao (2010). Recent advances in multilevel converter/inverter topologies and applications. International Power Electronics Conference (IPEC), 492ff.]. Such circuits are already in existence as DC voltage converters, inverters and converters. By suitably dividing the circuit into parts which each contain at least one energy store and at least one electrical switch, such circuits can be modularized. This provides advantages in terms of industrial production. The modular multilevel converter M2SPC mentioned above can be regarded as a combination or hybrid of traditional multilevel converters and switched-capacitor converters.

A central problem during the operation of many such circuits which are composed of a number of electrical stores whose electrical connection to one another (connectivity) can be changed dynamically during operation—for example can be changed dynamically from an electrical series circuit to an electrical parallel circuit in order in the process to reduce the overall voltage, the overall internal resistance and the current per module—resides in the balancing of the energy stored in each module. As a rule, the stores are electrical capacitors and/or batteries. The latter must not undershoot or exceed generally determined voltage limits here and should advantageously meet simultaneously determined further conditions relating to their electrical conditions (in particular voltage and current), in order to avoid aging too quickly. Because of the constant exchange of energy of each module with its neighbors as well as with external systems (for example the power grid, a motor or a generator) via all the terminals, the dynamically changeable connectivity serves, on the one hand, to selectively influence the energy content of each module by charging or discharging. On the other hand, precise knowledge of the current and/or previous electrical conditions of the respective modules is necessary for selected balancing and symmetrizing of the energy contents of individual modules or the control of the electrical conditions (in particular voltage and current). On this data base, one or more control units make decisions about the connectivity to be used in the future in order to adapt the electrical conditions such as the voltage, current and energy content of the individual modules with their integrated energy stores to predefined or determined target values, usually by means of selective adjustment.

In conventional solutions, for this purpose a complex measurement of the electrical conditions (in particular voltage and current) of the individual modules is usually carried out and transmitted to one or more control units.

In order to ensure the stringent necessary safety conditions and stability conditions, this measurement is usually carried out with several kilohertz of sampling rate. When significantly more than a hundred modules are used in many industrial implementations of the modular multilevel converter M2C, measurement data of the voltage and current which is sampled with high resolution, with several megahertz of data rate, is produced and has to be transmitted to the central unit and processed there. Since the individual measurement points in the modules are not related to a common reference potential, and the ground potential in each module also depends on the connectivity of all the other modules, the recording of the measured values and their transmission take place in an electrically insulated fashion (with separated potentials). On the one hand, this increases the complexity and susceptibility of the system to faults, and on the other hand this fact gives rise to high costs because the transmission has to make use of expensive components, for example high-speed optical transmission.

In the relevant literature, a number of approaches for remedying this problem have been discussed. L. Änquist et al. (2011) [L. Änquist, A. Antonopoulos, D. Siemaszko, K. Ilves, M. Vasiladiotis, H.-P. Nee (2011). Open-loop control of modular multilevel converters using estimation of stored energy. IEEE Transactions on Industry Applications. 47(6): 2516ff.] describe, for example, a method for estimating the energy content in each module on the basis of the measured current in an arm. Compared to the currently prevailing approach of balancing, symmetrizing and adjusting the energy content on the basis of measured values by means of each module, this approach eliminates the need for many of the necessary sensors, reduces the quantity of data to be processed by several orders of magnitude and can make available shorter adjustment reaction times owing to the elimination of the delay in the recording of the measured values and the multiplexing of data. The energy content of the energy stores in each module is estimated on the basis of the respective module current. The module current is in turn itself an estimated value which is derived from the measured arm current and the electrical switching state of the module (i.e. the connectivity, in this case the series circuit or bypass). The determination of the energy content of the respective module memories is carried out by determining the net charge over time by means of the respective module current.

However, this approach to a solution entails a substantial problem. The estimation of the individual module energy contents is based on the accumulation of the current and consequently contains a time integral over a current measured value. This integral is here not a short-term integral for averaging noise (for example in the form of a low-pass filter) but instead the calculation of a charge. In particular, current measurements are always to be considered to be subject to faults. In particular, slight measuring offsets, that is to say deviations of the measured zero point from the actual one, are present in virtually all current measurement systems. In addition, practical measurement systems are themselves often integrating or differentiating (for example typical Hall sensor-based current clamp meters or Rogowski coils) and therefore are not at all able to measure constant components.

As result of the integral over the current during the determination of the energy contents of the energy stores (also referred to as state of charge, SOC for short) small measuring offsets over time are amplified to a random degree. As result of the integral over time, even very small permanent offsets such as, for example, deviations caused by an analog-to-digital converter can lead to a substantial overestimation or underestimation of the actual energy content in the individual modules. Compensation or detection of the fault in a control unit is possible only given complete knowledge of the long-term energy take up at all the interfaces (terminals) with external systems. For example, Änquist et al. (2011) assumes perfectly harmonic currents which are offset-free, as result of which it would be possible to discover a potential offset in the measured values. However, since a real converter can control the currents with respect to its external terminals and in its arms itself and in the case of incorrect estimation can very easily take up more (or less) energy net than it outputs, such an assumption is not helpful. In addition, the described solution is only for very special converters and operating conditions. For example, an DC/AC converter is assumed. The modules used can be exclusively M2C modules with their very limited module states (serial circuit and bypass). The approach fails in the M2SPC modules with their parallel connectivity or else other module topologies. In addition, the approach to a solution must, for its functioning, dispense with all real problems of power-electronic circuits. These include, in particular, internal resistance switches of all the components and leakage currents in electronics and storage elements, for example capacitors and batteries. Because of the high fabrication variation of these two properties, even in components of the same series, they can, however, not be ignored, particularly in an integrating approach.

In commercial converter systems based on modular multilevel converters, which can often cost several hundred million dollars and have to be designed for uninterrupted use over several years (consequently the integrating time in the above approach to a solution from the state of the research), a systematic hazard resulting from a deficient control system with systematic faults which almost indisputably bring about destruction of the system, and under certain circumstances, fires, is therefore not advantageous.

Alternative, more stable technical approaches to the solution of the problem of the necessary precise knowledge of the electrical parameters in any model have not been presented until now. On the one hand, the practical problem when using current measured values which are integrated over time has not been sufficiently acknowledged or tested in realistic test environments. On the other hand, in specialist circles another solution to this technical problem is considered to be difficult and has not been satisfactorily solved by industrial development departments either. For this reason, despite the extremely high costs, measurement and monitoring of each individual energy store with respect to the operation of such converters continues to be the only approach used industrially.

SUMMARY OF THE INVENTION

From the analysis of the prior art it is known that a use of current measurements as a main source of estimation of the energy content of the energy stores in individual modules is subject to basic problems, and for this reason should not be used.

The present invention adopts a fundamentally different path. Instead of calculating the energy content in individual modules and/or energy stores by means of the inflow and outflow of energy and/or charge, an inverse estimation is performed. In this context, linearities of the system can be used to treat the converter as a coding system whose code is determined systematically with a technical solution. Since virtually all modular multilevel converters and switched-capacitor converters are voltage sources, the voltage is used as a central measurement result and unit of measurement.

In a linear case, the problem can be described very easily as a generation of a basis for a vector space and/or the solution of a matrix-vector equation. Both can be performed extremely advantageously and efficiently with integrated electronics. An equation can also be considered to be a mathematical combination. The terms variable, parameter and factor very largely follow the following: a variable denotes the value of a parameter, it also occurs as a factor in a formula or equation. These can be seen in equivalents in the following.

Current measured values are intentionally not used here in a chronologically integrated form if this chronological integral does not constitute a noise-averaging short-term integral (or filter Integral) but instead a charge calculation and therefore a long-term integral. Typical integrating times exceed here the period length of the alternating current which is generated or taken up by the converter (for example 20 ms in 50 Hz voltage grid). Such integrating times for determining the charge usually exceed a duration of several hours.

BRIEF DESCRIPTION OF THE DRAWING FIGURES

FIG. 1 shows two known modular multilevel converter topologies (M2C and M2SPC) from the prior art with converter arms (104, 105) and phase units (106) according to the prior art.

FIG. 2 shows three known module topologies for modular multilevel converters from the prior art, which usually contain at least one energy store (204; 211; 216), which is represented here as a capacitor but can also represent other electrical components (205; 212; 217) which can output and/or take up energy, and at least one electronic switch (201, 202, 206, 207; 208, 209; 213, 214). In addition, there can also be other elements included. Such components include at least two module terminals which can be used as electrical terminals in order to connect a module to other modules.

FIG. 3 shows three known module topologies for modular multilevel converters from the prior art, containing four module terminals in order to generate further states in contrast to those modules from FIG. 2. These states are necessary, for example, for the converter M2SPC. Modules can also have more than four module terminals in order to integrate further functions. These module topologies contain at least one energy store (304; 310; 320), which is presented here as a capacitor but can also represent electrical components (305; 311; 321) which can output and/or take up energy, and at least one electronic switch (301, 302, 306, 307; 308, 312, 313, 314; 315, 316, 322, 323, 324, 325).

FIG. 4 shows an embodiment of the invention. At least one dynamic voltage is measured by at least one voltage-measuring system (407) with the measurement points (405) and (406), and transmitted as an analog or digital signal (408) to one or more integrated circuits (409), via a partial line (403) of a line of modules (401) via, in each case, two electrical connecting lines (402) between adjacent modules, in this case without restricting the generality. The partial line (403) can comprise merely part of a converter or else an entire converter and can include all the modules. The signal (408) can be transmitted on one or more physical lines which are implemented electrically, optically, magnetically or with other known transmission media.

FIG. 5 shows an embodiment of the invention in which the measured voltage by voltage measuring system (503) is transmitted as an analog or digital signal (506) to at least one integrated circuit (504) which functions as an estimator. The at least one integrated circuit (504) receives, as an additional input signal, the current state vector s (510)—associated with the measurement—of the modules. On the basis of the voltage-measuring signal (506) and the state vector s (510) the integrated circuit (504) determines electrical properties (509) of the modules, which contain at least estimations of the module voltages of the partial line (501, 403) and which are transmitted to at least one integrated circuit (505) which functions as a controller of the converter. The integrated circuit (505) uses the electrical properties (509) of the modules to determine a new state vector s to be used, said state vector s being transmitted as a signal (511) to the converter in order to be taken in there by the electronic switches in the modules. The new state vector s to be used can contain here the modules of the partial line (501), more modules, fewer modules or other modules and can also be transmitted thereto.

FIG. 6 shows an embodiment of the invention which, as in FIG. 4, also includes at least one current measurement (609, 610) in addition to the at least one voltage measurement. The current measurement can be carried out here at one or more random locations, indicated by two measuring points (609) and (610). If two modules are connected by more than one electrical connecting line (602), the measurement can be carried out over some of the connecting lines (602) or all of the connecting lines (602). In a magnetic measuring system, the measuring loop is laid correspondingly around the selected part of the connecting lines (602). If the module line under consideration is not branched, all the current-measuring points, for example (609) and (610) are equivalent. The current measurement is detected by one or more integrated circuits (607) and output as an analog or digital signal (608) to a controller or an estimator (611). The at least one integrated circuit (607) can be the same which carries out the at least one voltage measurement via the measuring points (605, 606), or can be separate. Likewise, the signal (608) can contain both voltage information and current information or can contain just one of them and can use separate signals for voltages and currents. The signal (608) can be transmitted on one or more physical lines which are implemented electrically, optically, magnetically or with other known transmission media.

Figure 2:
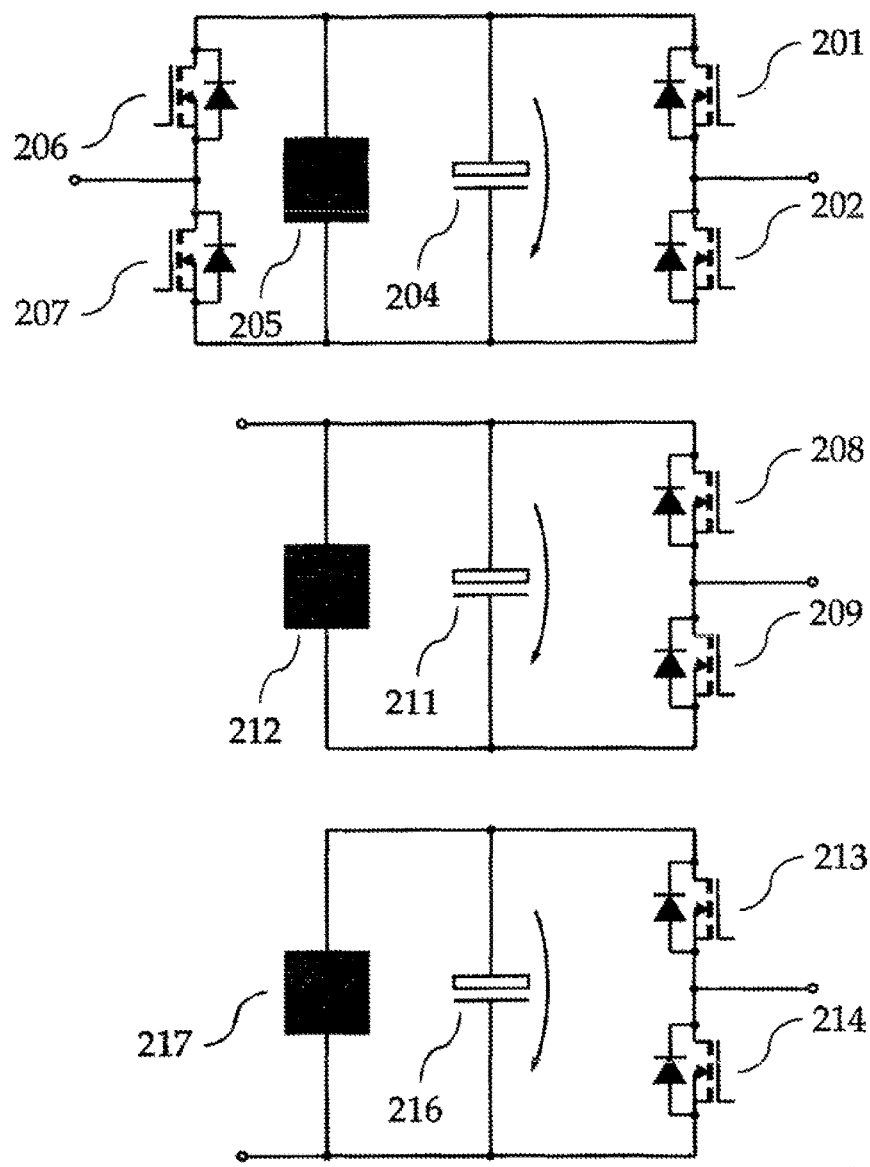
Figure 3:
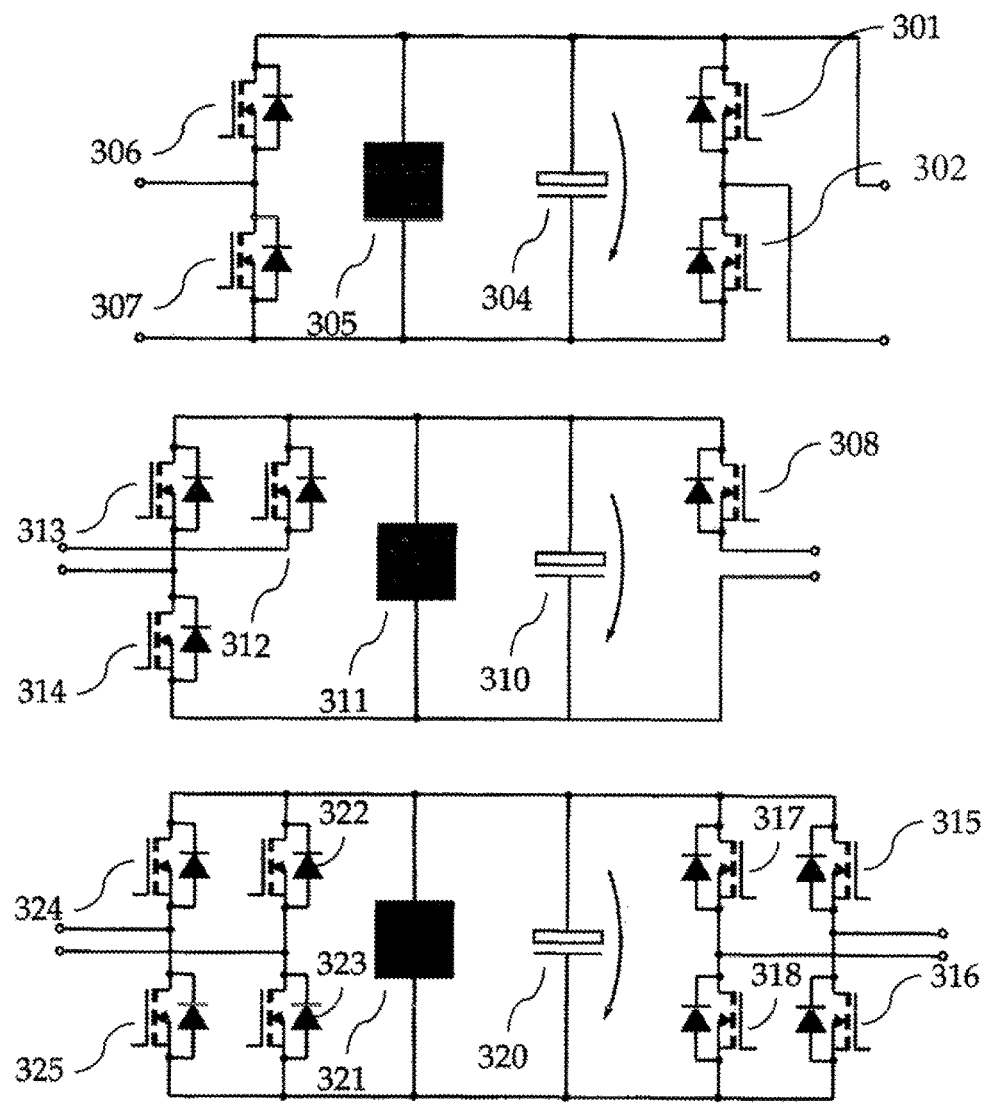
Figure 4:
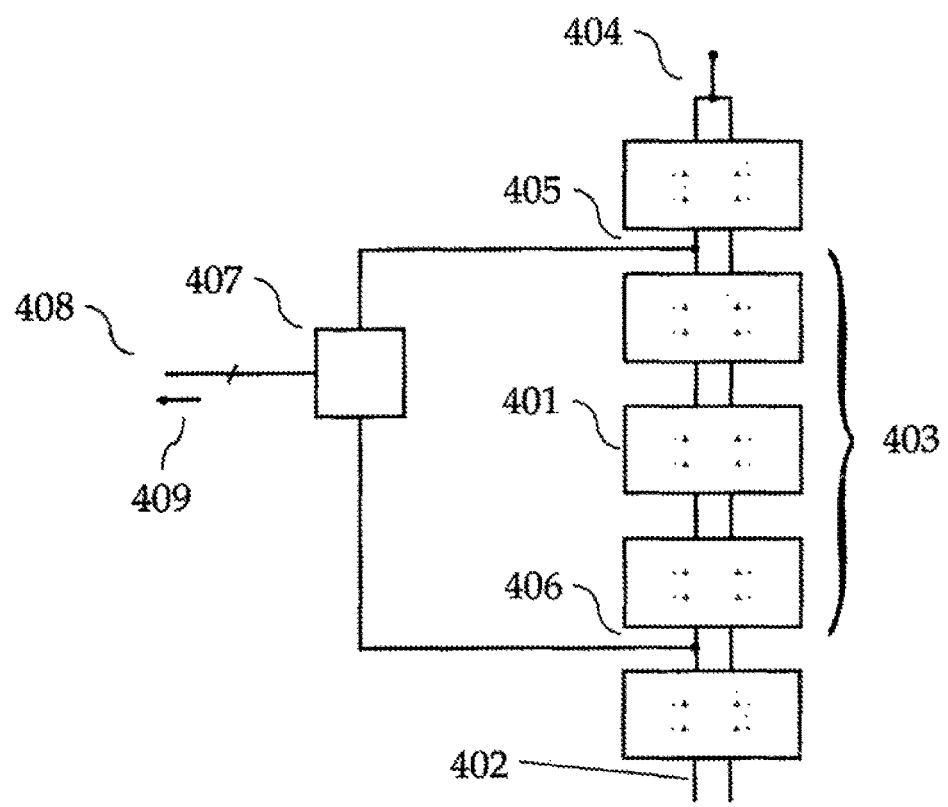
Figure 5:
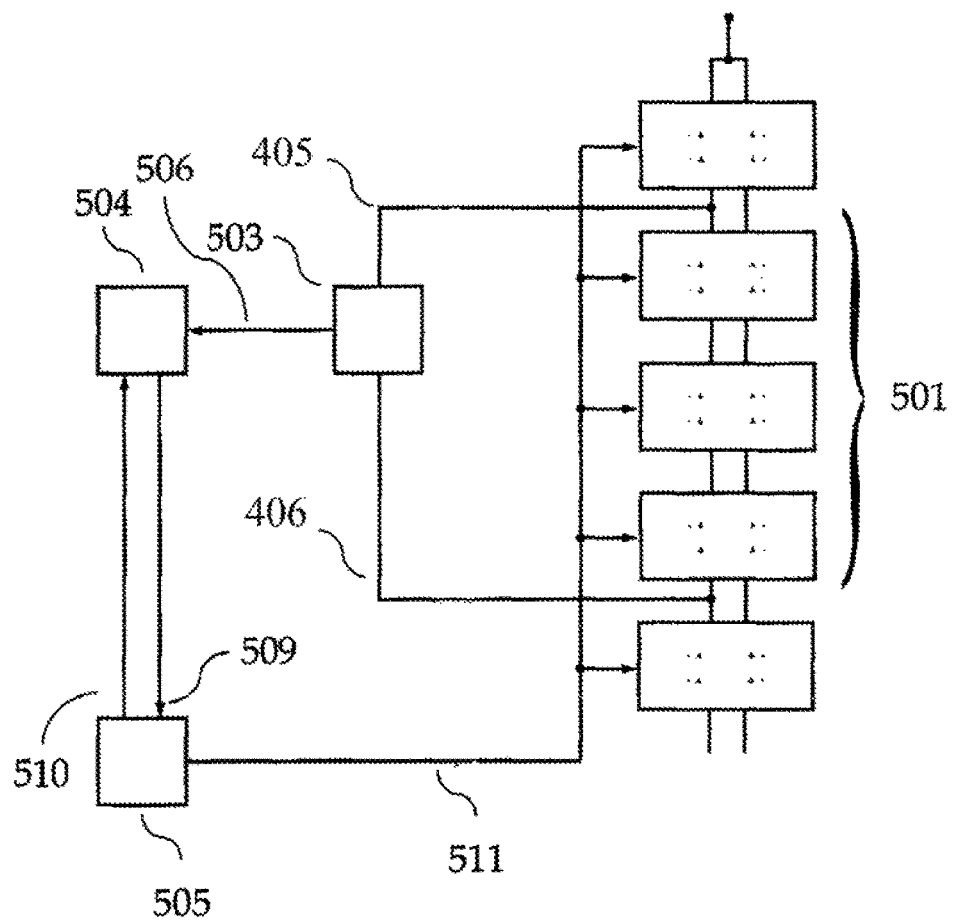
Figure 6:
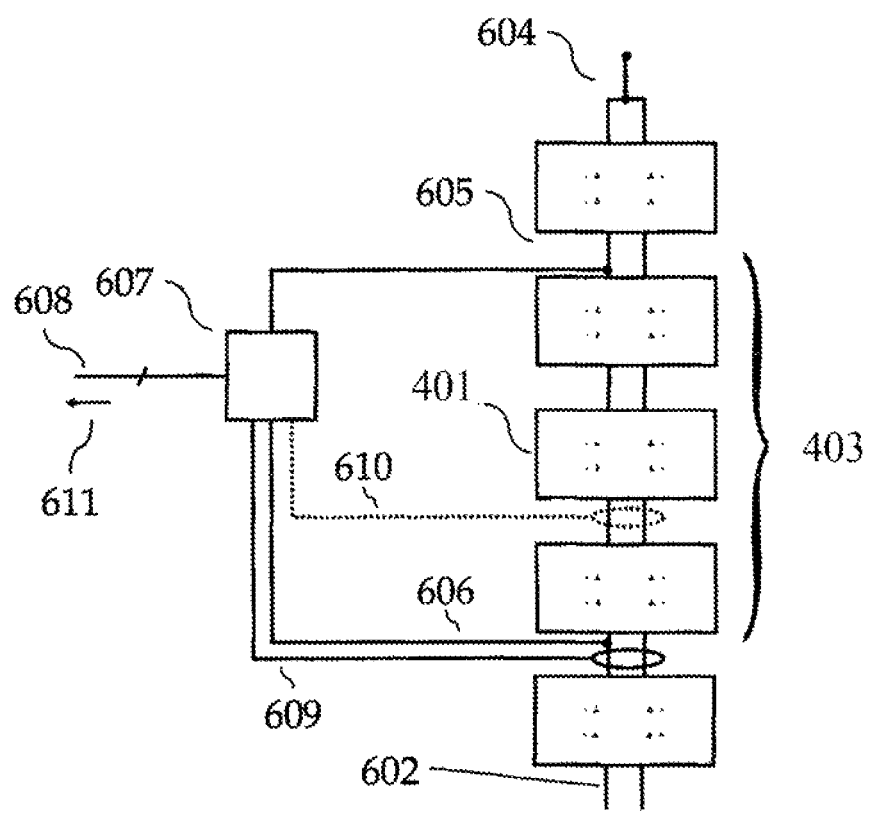
Figure 7:
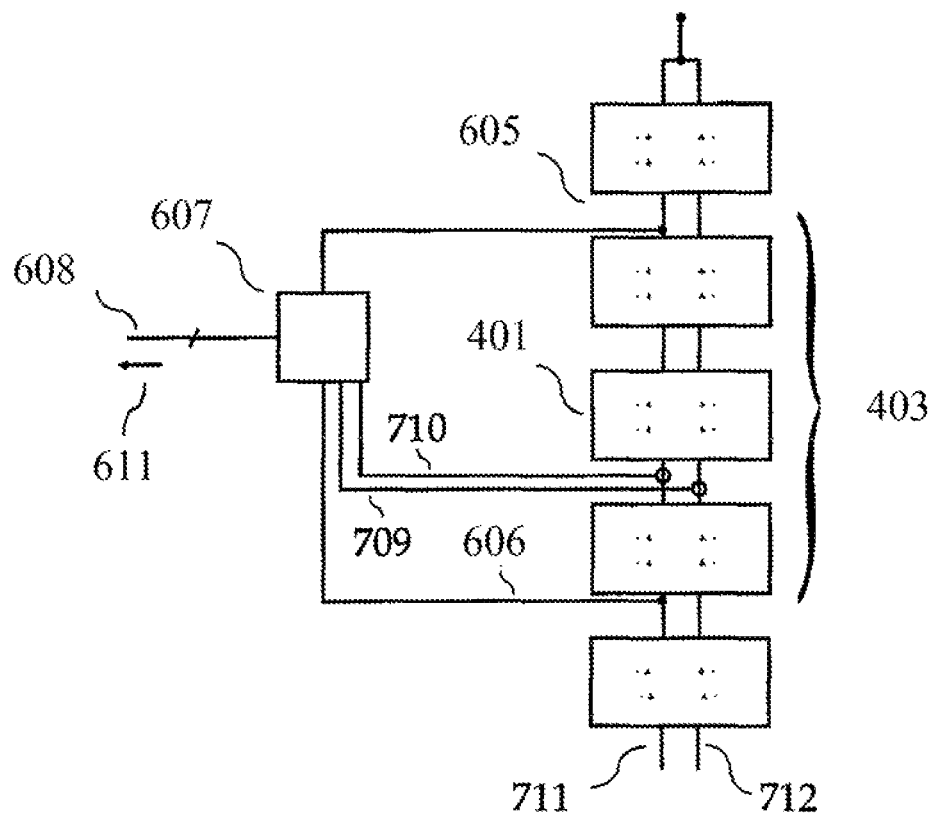
FIG. 7 shows a particular embodiment of the invention in which current measurements (709) and (710) are carried out separately for the individual connecting lines (711) and (712).
Figure 8:
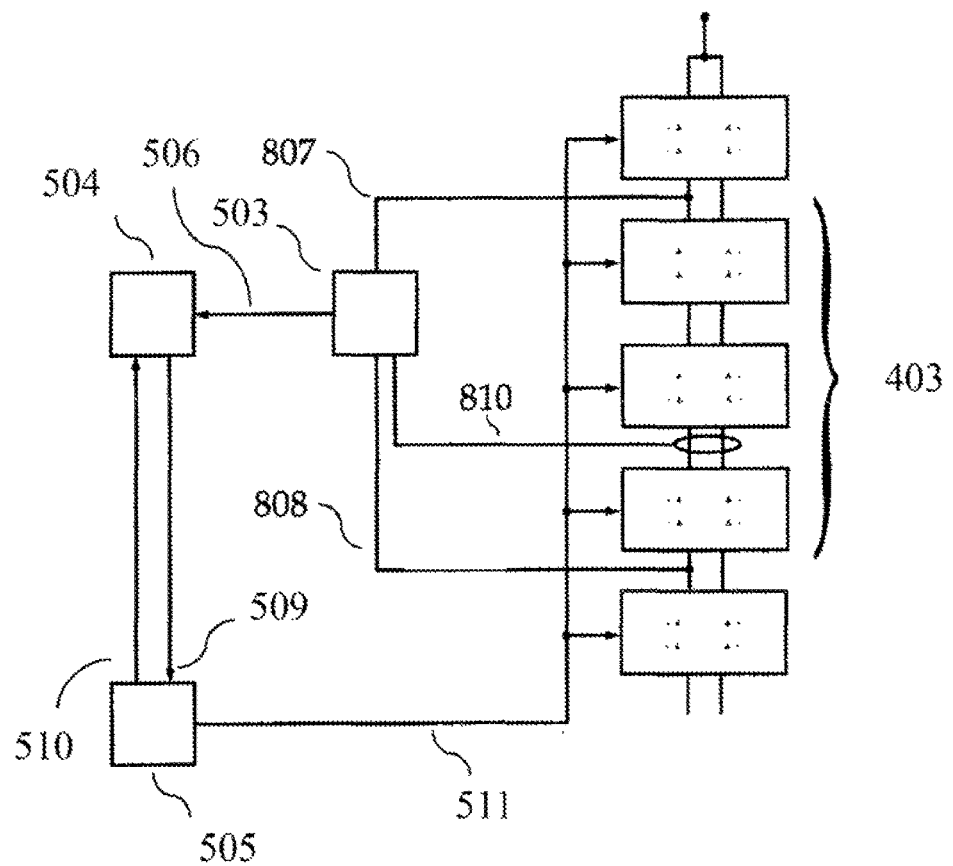
FIG. 8 shows a particular embodiment of the invention which includes at least one current measurement (810) in addition to at least one voltage measurement (807, 808).
Figure 9:
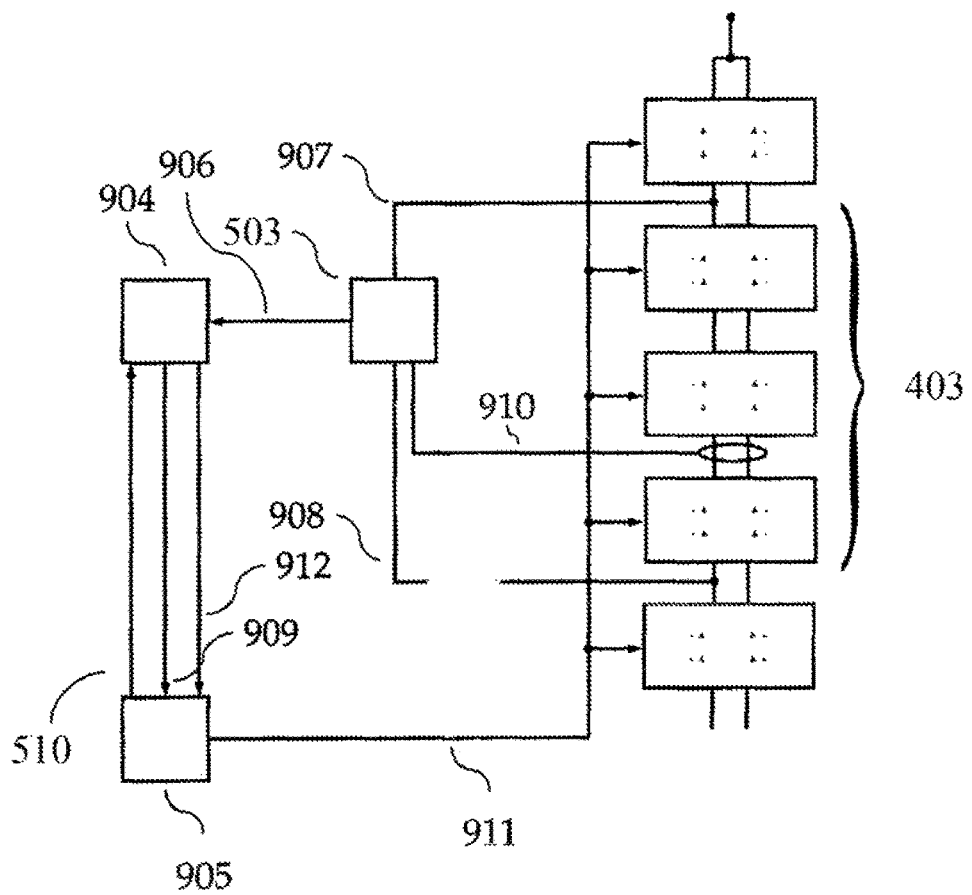

FIG. 9 shows a particular embodiment of the invention which includes at least one voltage measurement (907, 908), one or more optional current measurements (910), and in which the integrated circuit (904) transmits, in addition to estimated values (909), for example of the module voltages, also associated statistical measures (912) of accuracy to the integrated circuit (905) on the basis of which the integrated circuit (905) obtains information about the accuracy and reliability of the estimated values (909) and, if appropriate, also selectively sets the new module states (911) in the following time intervals in such a way that the accuracy of individual or of certain estimated values, for example of a module with a very inaccurate model voltage estimation, are improved selectively.

Figure 10:
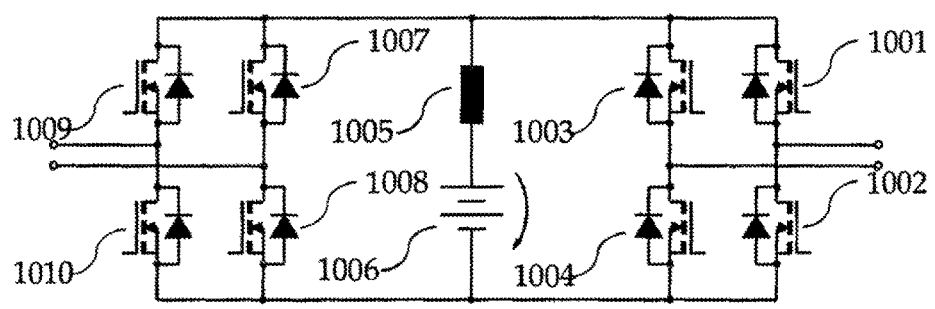

FIG. 10 shows the model of a module which is assumed by a particular embodiment of the invention, with a simple assumed battery model which constitutes one or more battery cells connected in series or in parallel, as an energy storage element, composed of a voltage source $V_m$ (1006) and an impedance $X_a$ (1005). A M2SPC module is assumed here without restricting the generality. Likewise, the battery model can also be used for other modules.

Figure 11:
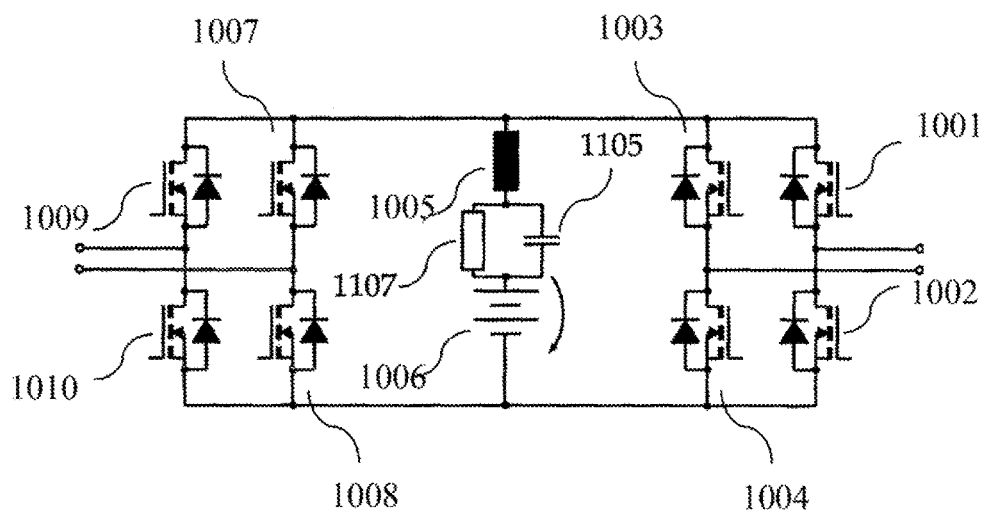

FIG. 11 shows the model of a module which is assumed by a particular embodiment of the invention, the battery model, expanded compared to FIG. 10, with an additional low-pass filter behavior formed by a resistor $R_b$ (1107) and a capacitor $C_b$ (1105). Without restricting the generality, an M2SPC module is used as an exemplary model type for the illustration.

Figure 12:
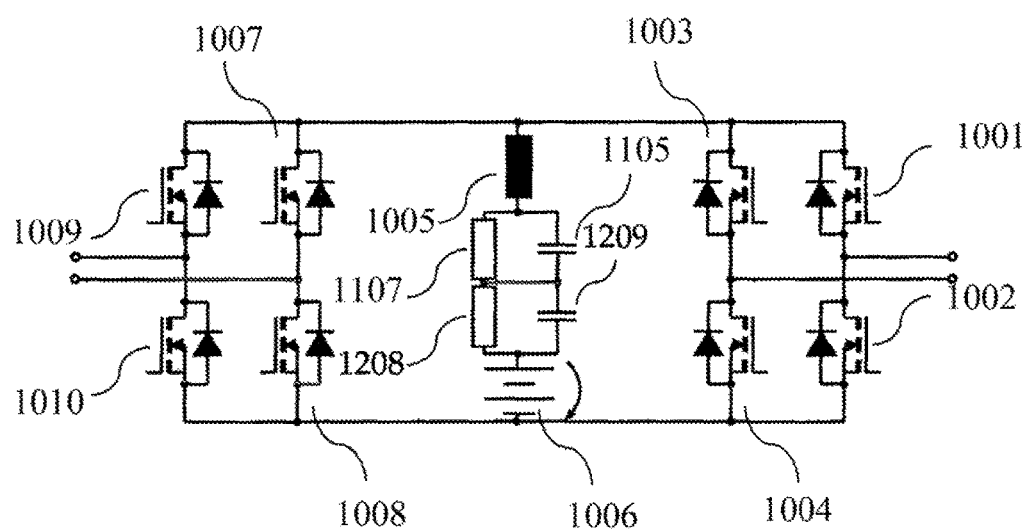

FIG. 12 shows the model of a module which is assumed by a particular embodiment of the invention, with a battery module which is expanded compared to FIG. 11 with a second additional low-pass filter behavior composed of a resistor $R_c$ (1208) and a capacitor $C_c$ (1209) formed by an M2SPC module is used as an exemplary model type for the illustration.

DETAILED DESCRIPTION OF THE INVENTION

In contrast to the prior art, the energy content of a module is not determined by means of integration of electrical current but rather by means of a voltage measurement. In the simplest embodiment of the invention, the overall voltage of a unit composed of a plurality of modules is measured and the module voltages are estimated on this basis. The voltage is consequently divided among the individual modules according to the module states which describe the connectivity of the modules. The unit composed of a plurality of modules can be the entire converter or else only part thereof, for example a converter arm or a section of a converter arm.

The total voltage $V_{unit}$ at each time t is therefore expressed as a function F of the module states s and of the module voltages (to be determined/estimated), which function has to be inverted:

$$V_{unit}(t) = F(s, V(i,t))$$

The estimated values for the module voltage are used here equivalently with the energy content, since it is assumed here that these two variables can be converted one into the other very precisely.

According to this simplified consideration, the relationship between the module voltages and the total voltage of the unit is linear and can be represented with a matrix M which is degenerated for a line vector, which matrix represents this modeling and depends deterministically on the current state of all the modules s. The module voltages of the modules V(i,t) are combined here as vector V(t):

$$V_{unit}(s(t)) = M(s(t)) \cdot V(t)$$

The modeling which is represented by the matrix M supplies here the voltage as a result as a function of the module states s, which voltage would be the currently expected output voltage of the unit for specific module voltages. For a positive series circuit of all the modules the matrix M would contain, for example, exclusively 1 entries; for a purely negative series circuit of all the modules the matrix M would correspondingly contain only −1 entries; if all the modules were in a bypass state, all the entries of the matrix M would correspondingly be 0.

One of the main reasons why this solution has previously not been recognized by a person skilled in the art is certainly that this equation system itself is not determined given a known matrix M(s), and therefore V(t) cannot be determined unambiguously from $V_{unit}(t)$. However, a time increment must not be considered separately here. In addition, a series of points in time must be combined. $V_{unit}$ therefore becomes expanded to form the $1^{st}$-stage tensor (equivalent to a vector), and M increases to form a $2^{nd}$-stage tensor (type of matrix equivalent), and V is therefore likewise now a $2^{nd}$ stage tensor (type of matrix equivalent) with modules as a degree of freedom and time as the second.

Since the module voltages do not change instantaneously owing to the module memories, they can be considered, in a simplifying fashion, as constant for a certain time, in order to simplify the inversion. As result, only V changes since the columns are considered to be approximately the same and are therefore used only as a mean value column. As soon as the rank of the expanded matrix M reaches the number of voltages in V, the equation system can be systematically unambiguously inverted. The matrix consequently contains an entire basis of the state space of the unit. If the rank is lower, a partial solution or estimated solution can be determined by means of known pseudo-inversion methods. If the rank exceeds the number of voltages in V, an averaging compensating calculation can be carried out in order to minimize fault influences, for example as result of measurements. In addition, in this case what is referred to as cross-validation can be carried out by solving the equation system for all the partial matrices of the matrix M which can be produced and which arise as result of elimination of individual rows of the matrix and have a full rank. The individual results can supply a mean value and other statistical properties such as, for example, standard errors, standard deviation and distribution functions. In addition, for each partial result on the basis of a partial matrix can be used in order to use the latter in the eliminated row or rows and their associated eliminated equation or equations for this partial matrix and to quantify their deviation.

In one particular embodiment of the invention, the estimation unit of the control unit transfers a signal with information about desirable module states for reducing the estimation uncertainty, for example of one or more voltages of module energy stores. In the matrix-vector form described above this corresponds, for example, either to an under determined equation system (the estimation uncertainty for one or more voltages is therefore theoretically infinitely large) or in the over-determined equation system (subject to noise) the same number of complete partial equation systems (partially disjunctive) is not present for all the variables and said partial equation systems can be, for example, respectively averaged for the compensation calculation. The equation system is therefore not over-determined to the same extent in all variables.

The provision of such a signal can, on the one hand, in the form of lists with states which can be compensated when applied to the converter and subsequent measurement with the few still necessary sensors as described above with the example of the matrix-vector equation with an under determinedness to form an entire equation system or unequal over-determinedness in individual variables. In the mixed model approach, this list can contain states which when used bring about uniform reduction of the estimation uncertainty (for example in the form of standard error measures, standard deviation measures, entropy measures or other statistical measures which quantize the fuzziness of an estimation distribution) of the individual estimated values. As result, the control unit can select and use from this list, within a certain predefined time, states which are closest to the other peripheral conditions (for example voltage at the outputs or terminals of the converter).

Alternatively, an abovementioned signal can be made available with information about desirable module states in order to reduce the estimation uncertainty in the form of a list which is ordered according to priority.

Alternatively, an abovementioned signal can be made available with information about desirable module states in order to reduce the estimation uncertainty (also estimation uncertainty) in the form of a list of any parameter to be determined (estimation variable), for example with the current estimation inaccuracy thereof, and states which are advantageous for the more accurate estimation thereof. In addition, the respectively expected reduction in the estimation inaccuracy can be transferred (for example as a statistical expected value) for each of the proposed states which are advantageous for more accurate estimation. In the case of on-line optimization in the controller, such as described, for example, in Goetz et alt. (2014) [Goetz, S. M. et al. (2014). Modular multilevel converter with series and parallel module connectivity: topology and control. IEEE Transactions on Power Electronics.], this information can be integrated, as an additional optimization goal and/or peripheral condition for other optimization goals and peripheral conditions, for example energy losses, output voltages, harmonics etc., into the control strategy.

The module voltages can be determined continuously during the customary operation of the converter under load, i.e. for currents which are unequal to zero. If this estimation is carried out for currents which are unequal to zero, the approach ignores internal resistances. If this estimation is also carried out for chronological derivations of the current which are unequal to zero, inductances are ignored.

In very compact structures which are operated only rarely at peak load or have a low internal resistance and/or parasitic inductances for other reasons, this procedure is sufficient. In addition, deviations owing to ignored internal resistances can be compensated in many cases, in particular if a converter is operated continuously with a net zero energy flow, consequently the energy which Is extracted from the converter and the energy which is stored in the converter are added from zero over a long period.

Alternatively, it is also possible to include only measured values at which the current and/or the derivation of the current become zero. For this purpose, in contrast to complete monitoring of the modules or of the unit no accurate measurement of currents or of their derivation is necessary. Instead, simple threshold value switches are sufficient, which switches can be implemented significantly more cost-effectively, and their signals can be electrically separated more easily for the transmission.

In addition, measurements with a negligibly small current and/or current derivation can also be carried out at regular intervals. Separate measuring sequences also have the advantage that in a short sequence entire state vector space bases can also be output selectively and in this context it is not necessary to take account of the operating point of the converter. Parts of bases are also possible, so that only a few module voltages or average values are determined.

These regular measuring sequences can carry out in the order of magnitude of milliseconds in the case of high-speed semiconductor elements such as FETs. In this context, for example an elementary base of the state vector space can be generated on the converter and the associated currentless output voltage vector $V_{unit}$ can be detected, in order to analyze the linear modeling completely and to determine the current module voltages.

In order to take into account the natural delay until the voltage to be measured reaches the state of equilibrium or final state after a change in state, it is possible to wait for a certain settling time after the setting of each new state until the actual measurement starts. In addition, the measurement can average over a certain integration time in order to increase the accuracy and avoid electromagnetic noise.

In particular, in motor vehicles, such pauses occur very frequently (traffic light phases) or can be generated artificially (idling phase on a freeway). At the same time, when the battery and converter are integrated into one unit, the module storage capacities are so large that there is no need for continuous measurement but instead regular determination is sufficient.

Taking into Account the Load (Extraction or Supply of Energy)

Ignoring the load state and current flows is disadvantageous in some cases and can give rise to deviations from the real values in the estimation in the case of high internal resistances and/or inductances. In this case, the system can be expanded with a current measurement. In this case, in addition to the voltage $V_{unit}$, the current $I_{unit}$ which flows into or out of the unit under consideration is measured. In contrast to the prior art, this current is, however, not used to determine a charge or is transferred to an integrator module (or alternatively into integration carried out by means of software).

The above basic equation can correspondingly be expanded with a current corrector term. An internal resistor R, which can also depend, if appropriate, on the state s of the module or of all the modules and can likewise be specific to the module i must be known for each module, in order, for example, to represent production tolerances and other differences between the modules. In addition, a resistance $R_{rest}$, which cannot be assigned to any module, must be taken into account.

$$V_{unit}(s(t)) + I(R_{rest} + R(i,s(i))p(s)) = M(s(t)) \cdot V(t)$$

If, in addition, (parasitic) Inductances are also to be included in the measuring device/the converter. Correspondingly, a second term with individual module inductances L and a residual term for inductances $L_{rest}$, which cannot be assigned to any module, are added. The solution is equivalent.

$$V_{unit}(s(t)) + I_{unit}(R_{rest} + R(i, s(i))p(s)) + \left( L_{rest}\frac{d}{dt}I_{unit} + L(i, s(i))\frac{d}{dt}I_{unit}p(s) \right) = M(s(t)) \cdot V(t)$$

As described above, these basic equations can also be postulated for a plurality of points in time in order then to obtain a completely determined, an over-determined or else a still under determined equation system with the assumption that the module voltages differ only insignificantly.

Measurement and Determination of Further Properties

In the above embodiments of the invention, central properties of the convertor and the measurement systems must be known in advance in order to be able to postulate and solve an equation system. These include, for example, the (optionally status-dependent) resistances of the modules, their inductances, residual terms or what are referred to as offset terms, which cannot be assigned to any of the modules or states. In addition, it is assumed that with the above approach no relatively complex dependencies can be easily modeled using matrix-vector equation systems.

For this reason, in one particular embodiment of the invention the energy content of the energy stores in the individual modules is determined using what is referred to as a mixed model or mixed effects model. In this model, for example, the load state can be included very easily and an approximation for negligible internal resistance no longer takes place.

$$V_{unit}(t) = V_{offset} + R_{rest}I_{unit} + \sum_{Module\ i} m(s)V(i, t) - R(i, s(i))I_{unit}p(s)$$

The total voltage of any unit, for example of a converter arm $V_{unit}$ is here from the sum of an optional offset $V_{offset}$, which can comprise voltage sources, material junctions (for example pn-junctions) with their inherent voltage stages or loaded memories outside modules, and also optional internal resistances $R_{rest}$, which are not assigned to any module, as well as a sum term, which comprises all the modules of this unit. The two first-mentioned residual terms outside the module structure represent the offset factor of the mixed model, which can also be referred to in German as an Achsenabschnitt [axis section].

The sum term includes the module voltage V(i,t) (to be determined) which depends on the module (i) as well as the time (t), and with a factor m multiplier $V_{unit}$ total voltage of a unit; continuous variable, measured $V_{offset}$ measured or estimated; continuous variable $R_{rest}$ internal resistance, which cannot be assigned to any module; continuous variable; measured, known or estimated $I_{unit}$ current flowing into the unit in question; measured or defined t time, generally continuous, but in this module for the sake of simplicity quantized, ordinal independent variable i module identifier; usually nominal variable, consequently unordered; usually finite; but an ordered enumeration can also be used, wherein numerically adjacent module identifiers i can, for example, represent adjacentness of the modules i in a module chain, for example of a converter arm of the M2C or M2SPC, s module state, dependent on the module; deterministic variable of the model, describes the state of the unit and is known to the control unit or units, non-continuous, nominal variable; mostly finite m module-type-dependent deterministic factor which converts module states into a factor which describes how the module voltage contributes to the total voltage; for the serially positive module state of the module i, m stands for module i, for example +1, for bypass 0, for the parallel state m depends on the state s of further modules; for this reason, this factor can, under circumstances, depend not only the state s(i) of the associated module i but rather on all the module states s of the unit; the conversion table can be trained either or even over a relatively long operating time, that is to say can be estimated as a dependent variable.

V module voltage, i.e. the voltage of the module-integrated electrical memory; dependent on the time t and the module; continuous dependent variable, is estimated R internal resistance of a module; this continuous variable can be known, for example measured in advance, or else can also be estimated as a dependent variable during operation; R usually depends on the switched state s of the module; a dependence on the module can be advantageous in order to be able to describe better, for example, production tolerances or different degrees of aging between modules, but is optional p analogous with the factor m which describes the state-dependent contribution of an Individual module to the total voltage of the unit, forms the deterministic factor p, how the current is divided, for example, when a parallel module connectivity is present; usually m and p are, for example p=1/m s the module state s(i) of a module i and the module states of a plurality of modules s={$s_j$} are known and are usually generated by one or more control units in order to satisfy the control goals of the system.

The estimation factors V(t), R(i,s(i)) can in this case contain stochastic components. In addition, the stochastic components can either be estimated with an assumed parametric distribution (for example Gaussian distribution) or non-parametrically together with their distribution function.

In one particular embodiment, inductances (in particular parasitic ones) are also included:

$$V_{unit}(t) = V_{offset} + R_{rest}I_{unit} + L_{rest}\frac{d}{dt}I_{unit} +$$
$$\sum_{Module\ i} m(s)V(i,t) - R(i,s(i))I_{unit}p(s) + L(i,s(i))\frac{d}{dt}I_{unit}p(s)$$

The inductances L of the modules are modeled here in advance as equivalent to the internal resistance and can either be conceived as being known parameters, for example from separate measurements, or can also be estimated during operation. Likewise, an optional offset term $L_{rest}$ can be provided.

The linear model shown can also be expanded as desired by adding additional terms or introducing dependencies relating to existing or new variables into the existing factors. However, there remains a minimum core, as described above, which is not removed. In addition, terms can also be removed in order to simplify the model and the estimation. This model can be simplified incrementally in a consistent way as far as the linear matrix-vector equation $V_{unit}$=M V shown at the beginning. In this way, even the simplest model and all the intermediate stages can be solved by means of this mixed model approach.

In addition, as well as the measured voltage of the unit, further measured values can be added in order to make the estimation more accurate and/or more independent of (measuring) errors and/or to acquire the possibility of detecting technical defects of the converter. Such parameters include, for example, the current flowing into the unit. In addition, the module voltages of individual modules can also be measured in order to evaluate the total estimation or make it more accurate. Both of these things can also be carried out at the same time with cross validation. The measurement of these individual module voltages can be carried out with a significantly lower frequency than the estimation interval.

In one particular embodiment, instead of the simple linear model of the equation shown above, a circuit simulation can be carried out in order to estimate module voltages on the basis of at least the voltage of the unit of one or more modules and of the module states of the corresponding module. While the mixed-module approach, for example in the equation last mentioned, can also be carried out without relatively accurate knowledge of the implemented electrical circuit in any individual module, only if the electrical variable which is important from the external perspective, in particular the voltage, in addition, for example, the internal resistance and further variables mentioned above, are estimated as a function of the module state, can a circuit simulation also determine properties of individual electrical components with a parametric model of the exact circuit. For this purpose, a linear or non-linear model of the circuit can be solved in a traditional circuit simulation system, for example on the basis of the widespread spice system, wherein an additional optimization system determines the parameters in such a way that the circuit shows a behavior which is as similar as possible to the measured values. The similarity of the values estimated in the simulation compared to the measured ones, for example of the total voltage of the unit, from one or more modules and/or the current and/or further measured values, can be defined, for example, by means of the sum of the quadratic difference. Typical known global optimization methods, for example particle swarm optimization, evolutionary algorithms or simulated annealing, known local optimization methods, for example the simplex method, and hybrid methods which combine both, can be implemented as an optimization system.

In one particular embodiment, the estimation of the control of the converter not only makes available estimated data but also influences the module states in the future in such a way that the estimation supplies more precise results or particularly emphasizes individual modules. In a list-based control system, such as for example that described by Lesnicar et al. (2003) [A. Lesnicar and R. Marquardt (2003). An innovative module multilevel converter topology suitable for a wide power range. IEEE Power Tech Conference Proceedings, 2003(3):6] or else Goetz et al. (Goetz, S. M. et al. (2014). Modular multilevel converter with series and parallel module connectivity: topology and control. IEEE Transactions on Power Electronics.] can be used here as an alternative or additional selection criterion for the next state pattern, to be carried out by the converter, of a, which prefers such state patterns, which is not dependent with those of the most recent past or of least is dependent linearly. This can be done, for example, by forming the scalar product with all the previous bit patterns and their summation. In addition, weighting with the past can be included, for example in the case of an optimizing control system which operates with control goals, an additional control goal can be added to a competitive control system. For example, an accuracy measure of the estimation ($R^2$, likelihood residual variance as well as all those mentioned already in the text) can be used as an optimization goal for minimization. Insofar as one total accuracy measure is not available but rather a plurality thereof, for example for each parameter, an arithmetic combination, for example a p-standard can be used for these. If a p-infinite standard is applied, this corresponds to that of the accuracy of the parameter estimated with least accuracy. In all cases, the estimation of the parameters is automatically improved successively.

In one particular embodiment, a control unit analyzes the change in the values individually or of all the estimated variables, for example of the module voltages, over time t, and in the case of improbable events triggers a warning of an operator or automatic checking with which possible errors in the estimation are evaluated so that the control unit does not make disadvantageous or dangerous decisions for the next control step, on the basis of a potentially incorrect estimation result. Such improbable events are, for example, very fast increases or drops in a module voltage even though a considerable storage capacity, for example capacitor or batteries, in a module. Such information can also be used for detecting possible aging processes or failures of modules. In this context, for example changes in specific directions (positive or negative) and/or changes which exceed a specific threshold value can trigger a signal which indicates that degradation or aging has been discovered.

In one particular embodiment, at the same time the respective module voltage is estimated on the basis of the module current by means of integration of the capacitor equation. The module current can either be measured or determined from the total current of the unit $I_{unit}$. Therefore, this embodiment is similar to the solution approach of Änquist et al. (2011) described in the prior art. However, this alternative estimation is not for the further control of the system but merely as a control in order either to trigger a warning for the operator or automatic checking or to assign a reliability assessment (for example one or more what are referred to as soft bits or a reliability measure) to the result of the main triggering. In addition, a potential offset in the current measurement can also be detected if this alternative solution based on the integration of the module current drifts away continuously with respect to the main solution.

In one particular embodiment, reliability measures, arising from the estimation of the mixed model are additionally assigned to some or to all of the estimation variables. In the case of a least squares estimator, this measure can be determined from the (potentially quadratic) residues or the variability which cannot be explained by the model. A likelihood estimator can also make available, by means of the Fisher information, a formal reliability measure for each estimated value. In the case of Bayes estimation methods, a reliability measure can be obtained for each estimated value from the a-posteriori probability distribution of the estimated values, for example the second moment of the distribution with respect to the corresponding estimated value. In addition, Jacobi matrices (sum of all the functional derivations) of the sensitivity can be calculated for all the estimated values according to known methods which indicate how sensitively the results depend on the individual measured values. A high level of sensitivity is here an indication of a high level of susceptibility to a typical value.

In one particular embodiment, the estimated internal resistance values of the modules can be monitored for estimation changes (visible in a slow drift of the estimated values over time) or, for example, can be reset regularly and newly estimated in order to detect changes. A strong increase can permit an imminent failure of a module, of a semiconductor or of a memory to be inferred. A further analysis, that is to say determination of the accurate state-dependence of the resistance-dependence in this module can permit, under certain circumstances, accurate assignment of the fault to individual components. For example, an increase in resistance which does not occur in a bypass state but in all the other states can be assigned with a high level of probability to a memory. Similar assignments are also possible for individual switches, depending on the converter circuit used.

In one particular embodiment of the invention, energy losses in the energy memories of the modules are taken into account by means of so-called leaks. In this context, a possibly module-voltage-dependent leakage current (often referred to as a reactive current) which empties the loaded memory, flows. Such a current can be, for example, a residual current through the insulator of a capacitor. In this embodiment, such a leakage current can be included, for example, by subtracting a known time-dependent voltage loss.

Alternatively, the leakage current can also be determined and estimated by means of the measurement. This leakage current can be module-dependent and also state-dependent. In addition, the leakage current can be age-induced and, for this reason, can change in the course of the service life of the converter.

In one particular embodiment the module internal resistance R of each module insofar as per module i it is present only as a resistance in dependence on the module state s(i) as R(i,s(i)) is divided by means of the knowledge about the electrical circuits, implemented in the modules, among individual electrical circuit components in the circuit. When the current path for the respective state is taken into account the electrical circuit components which contribute to the internal resistance in the respective state can be determined. As result of the fact that usually a plurality of electrical circuit components contribute to the internal resistance in each state, but the same (linear) combination of circuit components do not contribute in each state, individual components can be inferred by computation.

For example, the internal resistance in a conventional M2C four-quadrant module in the bypass state is caused by the two lower transistors, in the positive state by the left-hand lower transistor and the right-hand upper transistor and the memory, in the negative state by the left-hand upper transistor and the right-hand lower transistor and the memory. If the module internal resistance rises, for example, only in the positive state but in no other, degradation of the energy store of the module can be ruled out with a high level of probability, since said energy store is also used in the negative state, and there is a high probability that the fault will be found in the right-hand upper transistor, since the lower transistors are also used in the bypass mode which is not adversely affected.

Similar dependencies can be specified for other modules. Therefore, the resistance R and changes thereof can either by assigned individually, or to a group of a plurality of electrical circuit components. This has the advantage that, for example, degradations can be traced back to triggering, affected circuit components or to a group of affected circuit components. This particular embodiment carries out such an assignment and passes on the result to the control system and/or to a display and/or to a logging unit as a signal in order, on the one hand, to inform, for example, the user or technician for the repair or maintenance and, on the other hand, and significantly more importantly, to take into account this information in the control system with respect to the future module use. It is particularly advantageous here, on the one hand, to take into account the influence of increased internal resistances on the efficiency and therefore to avoid the module states with increased internal resistance, for example, in the case of high currents, for efficiency reasons. In addition, the control system can use the module less in general, in order to bring about uniform aging of all the modules and/or electrical circuit components.

In one particular embodiment, the module energy stores contain at least one battery cell, and the power electronics also carry out the battery management in addition to the energy conversion (for example with respect to an alternating voltage for a motor). This means that an additional measurement of cell voltages or voltages of individual battery cell groups can be dispensed with entirely or virtually entirely.

In addition, a series of points in time must be combined.

In one particular embodiment, in order to achieve the completeness or over-determinedness of the equation systems or the reduction in the estimation fuzziness of the mixed model, a series of points in time, for example of the module storage voltages are not combined in an unweighted fashion. Instead, Individual dynamics are assigned to each module energy store, or a common dynamic equation, containing estimation parameters itself, is assigned to all the module stores of the same type, but an example for are linear dynamics of the first order such as, for example, the capacitor equation (time derivative of the energy store voltage=constant A×current+constant B). In addition, non-linear elements can be added (time derivative of the energy store voltage=constant A×current+constant B+constant C×square of the current) or the constants have a predefined dependence on the voltage and/or the derivative of the voltage. The constants can either be predefined or estimated in the estimation process with the other parameters. By using a time-dependent dynamic equation for the voltages of the modular energy stores instead of an unweighted conversion of a plurality of points in time, the fault owing to discharging or charging is reduced and instead the charging and discharging behavior is also integrated into the model.

In all the embodiments, the estimation can be implemented in the same integrated circuit or circuits, for example microcontrollers, signal processors or FPGAs, which also carry out the control of the system. In addition, both can be carried out in separate integrated circuits. Both can be implemented in respective individual central integrated circuits or in respective distributed circuits. In addition, an exchange of data can take place between the separate integrated circuits.

In one particular embodiment, the internal resistance of the module i, represented above globally as R(i,s), of the module contains, dependent on the state s as replaced by a network of individual resistors which model conductive module components in the current state s. In the simplest case, each closed circuit and the energy store are assigned an internal resistance. In the simplest case, these values for circuit components of the same type are assumed to be identical and are described by an individual variable. In order to be able to model production tolerances and different rates of aging, individual variables are also used for some elements or for each element. The individual resistances can either be known here and serve as independent variables or can be estimated as dependent variables in the estimation. Alternatively, instead of an assignment of an internal resistance to each circuit component, an internal resistance of the entire module can also occur as a function of the state s of a module. This internal resistance can either be estimated as a function of the module state or else used as a known variable, and therefore as a constant during the estimation. In this simplification with one internal resistance per module depending on the module state, the precise electrical circuit does not need to be known in the modules.

In one particular embodiment, an individual predefined model is not estimated but instead an optimum of flexibility and stability is found taking into account the measured values which are present. This particular embodiment uses the possibility of expanding the model as already mentioned above, in order to find an equilibrium between what is referred to as the high variance state and the high bias state as follows:

For the estimation, for example of a mixed model, it has already been stated that the basic estimation equation can be expanded as desired. Such an expansion can take place in two ways:

a) in addition to the dependencies already presented above, further influencing factors, not taken into account hitherto at all in the equations of the model, can be introduced as dependencies. For example, the resistance R(i,s(i)) in the model can also be described as a function of the temperature $\theta$ and/or the time t and/or the humidity $\varphi$ and/or the mechanical pressure p at one or more electrical components of the circuit and/or other ambient parameters. This alternative consequently denotes the addition of further external effects which have previously not been included.

b) In addition, the dependencies of the variables already present in the equation can be expanded on one another. In mixed models, dependencies, which are expanded in such a way, of one or more variables on other variables which are already present in the equations of the model are often referred to as interaction. For example, a resistance can depend not only on the module state s and, under certain circumstances, individually for a module (and therefore depend on i) but also depend on the module voltage or current or other variables in the system. In the case of all these interactions being taken into account completely, each variable is dependent on every other variable.

As is customary in the case of mixed models, in the case of dependence of a dependent variable on nominal variables for every possible value of the nominal variable a value is estimated for the variable which is dependent thereon. In the case of dependence of the dependent variables on continuous variables, in the simplest case an (affin) linear function is usually assumed. In addition, in the case of dependencies on continuous variables the (affin) linear dependence on the continuous variable is either replaced by a logarithmic dependence or expanded by higher non-linear terms of a series (for example quadratic, cubic or quartic dependencies on the continuous variable).

If the model of the equation last shown is taken as an example, six values are present deterministically, i.e. known values (s, $V_{unit}$, $I_{unit}$, p(s) i, m) and five unknown values ($V_{off}$, $R_{rest}$, $L_{rest}$, V, L) are present. Given complete dependence of each unknown parameter on every other (known and unknown) parameter up to the third order, 5×[1+3×(6+5~1)]=155 degrees of freedom are present. Although this model constitutes the most accurate and most flexible model, this model is very easily "over-dimensioned" for an insufficient number and/or insufficiently scattered measured values. The particular embodiment determines the model to be used here automatically and attempts to compensate between a high-variance state and a high-bias state. The particular embodiment assumes for this purpose.

In this context, it estimates the plurality of modules simultaneously and determines a so-called measure of goodness-of-fit for each model, as is known in the statistics. This includes, for example, the Bayes information after Schwarz, the Akaike information, the Kulback-Leibler divergence and cross validation. The model with the best goodness-of-fit is used here as a decisive model. Since the number of available measured values increases with a relatively long operating period, and therefore a relatively complex model with expanded dependencies could have better goodness-of-fit, it is possible, if appropriate at regular intervals, to change the decisive model (after previous comparison of a plurality of candidates on the basis of the goodness-of-fit). Therefore, this particular embodiment itself selects the model to be used on the basis of principles which merely have to be specified, for example a list of variables and parameters, from the linking of all the available variables and parameters up to a specific polynomial dependency. Since a plurality of such modules can be parallelized with different complexity of the dependencies and solved vectorily for the estimation, this particular embodiment is extremely advantageously implemented in integrated circuits.

In one particular embodiment, each module is represented by a network of individual resistances which model the module components which are conductive in the current state s, for example electronic switches (1001, 1002, 1003, 1004, 1007, 1008, 1009, 1010; 1101, 1102, 1103, 1104, 1109, 1110, 1111, 1112; 1201, 1202, 1203, 1204, 1211, 1212, 1213, 1214_, and a voltage source with the module voltage V(i). The voltage source represents the at least one energy store of the module and can also have an internal resistance added to it.

In one particular embodiment, the internal resistance is represented in the model of the energy store by a customary battery model. This battery model can represent at least one battery cell (1006) as an energy store with the voltage $V_m$ and can contain, for example, an impedance $X_a$ (1005; see FIG. 10) which can contain both a real (Ohmic) and a virtual (reactant) component. In many cases, the virtual component of $X_a$ can be considered to be negligible. In addition, as well as $X_a$ one or more RC elements (1107, 1105 and 1208, 1209; see FIG. 11 and FIG. 12) can contain. The time constants of the respective RC elements are usually of the order of magnitude of $R_bC_b \sim (1 \times / \div 4)$ min and $R_cC_c$ $(2 \times / \div 4)$ ms, wherein $\times / \div$ stands for a multiplicative variation. The parameters $V_m$, $X_a$, $R_b$, $C_b$, $R_c$ and $C_c$ can either all be estimated or partially predefined. In addition, these parameters can partially be assumed in a time-dependent fashion. For the voltage $V_m$ it is obvious to assume a time dependency.

In another embodiment, one or more modules are used as a standard or reference for determining the voltages of the energy stores of the rest of the modules. For this purpose, precise voltage measurement of the one or more modules is carried out (either separately in each of the one or more modules or as a sum over all of them together in one measurement) and an additional measurement either of the total current or of the sign of the total current or of the presence of a negligible current (for example as a status bit 1, if the absolute current undershoots a specific threshold) or of the sum voltage of the modules to be measured (for example 403) or of the sign of the sum voltage of the modules to be measured (for example 403) or of the presence of a negligible sum voltage of the modules to be measured (for example 403). In this particular embodiment of the invention, either a zero state, either of the sum voltage of the modules to be measured or of the sum current flow and therefore by achieving a complete or over-determined equation system the other parameters, can be determined on the basis of the measured module voltages and the additional information about the sum voltage of the modules to be measured or of the current flow. Given the presence of an accurate sum voltage measurement of the modules to be measured instead of just one zero crossing information item about the current or voltage, the other parameters can additionally be determined also in an equivalent fashion without bringing about or waiting for sufficiently large numbers of different zero states for a complete or over-determined equation system. In the case of an additional sum voltage measurement of the modules to be measured or of the zero state of the sum voltage of the modules to be measured, some or all of the one or more reference modules are advantageously part of the modules to be measured. The one or more reference modules can also be voltage standards whose voltage or voltages is/are known, and therefore do not have to be measured. Exemplary voltage standards are semiconductor junctions. Therefore, when these voltage standards are used, comparisons can be made about the generation of a zero state (voltage or current) with all the possible combinations of other modules or the measured sum voltage, which permits determination of the voltage of the modules to be measured.

In one particular embodiment, the invention comprises a method for controlling an electrical circuit which includes at least two modules which are similar to one another and which each contain at least one electrical energy store and at least one electronic switch which permits the changing of the connectivity, that is to say the electrical connections (for example in parallel or in series) of the at least one electrical energy store with the energy stores of other modules. A calculation permits the voltage of the Individual energy stores of the modules of a group of a plurality of modules to be determined from measured values of the voltage generated by said group of a plurality of modules. A group of a plurality of modules contains here at least two modules.

In one particular embodiment, the abovementioned equation represents the measured voltages of the group of a plurality of energy stores as a mathematical combination of the voltages, to be determined, of the energy stores of the modules of the group, wherein the mathematical combination is defined by the switched states, present during the voltage measurement, of the modules of the group. The voltages of the energy stores of the modules are determined by solving the mathematical combination in such a way that the determined voltages of the energy stores of the modules in the mathematical combination have the measured voltages as a mathematical result.

In one particular embodiment, the abovementioned mathematical combination additionally includes, as well as the voltages, to be determined, of the energy stores of the group of a plurality of modules, at least two measured values of the current flowing through some of the group or the entire group of a plurality of modules, which values have been measured in different switched states of the modules.

In one particular embodiment, a thermal model is also estimated in addition to an electrical model. The electrical and the thermal model are coupled here by means of electrical parameters, in particular the current. The temperatures of individual components, for example storage cells, semiconductors etc. can be either estimated here in order to make them available to the controller of the converter for the decision of the controller in the future, for example the reduction in load of hot modules etc. In addition, these can also (partially) be measured in order to permit or simplify the estimation of other variables, for example thermal resistances.

Likewise, the external temperature can be input as a variable into the model and either measured or estimated.

The following model represents the temperature θ per module as a function of electrical conditions.

$$c_{therm}(i)(\vartheta(i)-\vartheta_{amb})=R(i,s(i))(I_{unit}p(s))^2$$

The thermal capacitance $c_{therm}$ is here a continuous variable which can either be estimated or predefined. The ambient temperature $\vartheta_{amb}$ can be measured, defined (wherein the value 0, that is to say an elimination, is a justified definition) or estimated. The coupling of thermal and electrical domains is carried out here both by means of the electrical resistance R as well as the current $I_{unit}(s)$. Alternatively, merely one coupling by means of the current can occur and a separate electrical resistance R can be used, which is either estimated of predefined.

Alternatively, the temperature can also be determined separately for parts of a module, for example specific semiconductors or one or more memories. The estimation model is to be correspondingly adjusted.

The invention claimed is:

1. An electrical circuit comprising:
   at least two plurality of modules which each have at least one electrical energy store and at least one electronic switch configured to change electrical connections of the at least one electrical energy store to the energy stores of other modules of the plurality of modules, and
   at least one voltage-measuring device, coupled to the plurality of modules, configured to measure an electrical voltage generated by a group of two or more of the plurality of modules, in at least two different switched states s(t) of the modules within the group, and to automatically determine voltages of the electrical energy stores of the individual modules within the group from the electrical voltages generated by the group, wherein:
the two or more modules each bring about at least two switched states which each define how the energy stores of the two or more modules are connected to one another in an electrically conductive fashion wherein one group of modules contains at least two or all of the modules of the electrical circuit, and
the electrical circuit:
(i) combines the automatically determined voltages of the electrical energy stores of the individual modules as coordinates in a vector V(t), and
(ii) maps the automatically determined voltages as an electrical voltage $V_{unit}s(t)$ from the measured electrical voltage generated by the group at a respective time (t) as modeled by a matrix M(s(t)) that is a function of the at least two different switched states s(t), such that $V_{unit}$ (s(t))=M(s(t)) dot product V(t).

2. The electrical circuit as claimed in claim 1, wherein the two or more modules each bring about at least two of the following three switched states:
the at least one electrical energy store of a module is connected in series with the at least one energy store of another module using electrical switches;
the at least one electrical energy store of a module is connected in parallel with the at least one energy store of another module using electrical switches;
the at least one electrical energy store of a module is bypassed using electrical switches, which means that the at least one electrical energy store of a module is connected in an electrically conductive manner at maximum by just one of its at least two electrical contacts to an electrical energy store of another module, and therefore there is no closed circuit with an electrical energy store of another module.

3. The electrical circuit as claimed in claim 1, wherein the voltages of the electrical energy stores of at least two modules are determined in at least one estimation time by at least one integrated electronic circuit.

4. The electrical circuit as claimed in claim 3, wherein the at least one integrated electronic circuit estimating time receives, as input signals, at least one digitized measurement signal of the electrical voltage generated by the group of modules, from a measuring unit, and receives at least one signal describing a current module state from at least one control unit.

5. The electrical circuit as claimed in claim 4, wherein the time estimation is carried out by the integrated electronic circuit according to a digital clock cycle at fixed time increments.

6. The electrical circuit as claimed in claim 5, wherein the at least one integrated circuit for estimating time contains at least one digital memory module which stores at least the module states and the measured values of the generated electrical voltages of a group of a plurality of modules of a plurality of elapsed digital clock cycles.

7. The electrical circuit as claimed in claim 4, wherein the at least one integrated circuit for estimating time transmits at least one signal which describes the estimated module voltages of the individual modules.

8. The electrical circuit as claimed in claim 1, wherein the voltage-measuring device also measures, in addition to the voltage, the electrical current flowing into the group of modules, and uses it for the automatic determination of the module voltages of the individual modules.

9. The electrical circuit as claimed in claim 1, wherein the voltage-measuring device also comprises at least two voltage-measuring apparatuses, each of which measures the electrical voltages, generated by a respectively associated group of a plurality of modules, in at least two different switched states, wherein individual modules are part of a plurality of groups associated with the specified, in each case, at least one voltage-measuring apparatus; and wherein an estimation error of the determined voltages of the electrical energy stores of the individual modules is determined with the at least two voltage-measuring apparatuses, or a technical failure of at least one of the at least two voltage-measuring apparatuses is detected.

10. The electrical circuit as claimed in claim 1, wherein the device also contains at least one temperature-measuring apparatus which measures a temperature of a module or at least of an electronic switch of a module or at least of an electrical energy store of a module or of a group of a plurality of modules.

11. A method for determining a respective voltage of a multiplicity of electrical energy stores, wherein in each case at least one electrical connection between individual energy stores is separated from one another by, in each case, at least one disconnecting electrical switching element, and wherein the multiplicity of electrical energy stores and disconnecting electrical switching elements are part of a modular electrical circuit, comprising at least the following steps which are carried out in a cyclically repeating fashion:
measuring a respective electrical voltage formed by connection of the specified multiplicity of electrical energy stores in each of at least two different switched states s(t) of the specified disconnecting electrical switching elements;
digitizing the specified measured electrical voltages;
transmitting the digitized measured electrical voltages to at least one integrated electrical circuit; and
estimating respective voltages of each of the multiplicity of electrical energy stores from the digitized measured electrical voltages for the specified multiplicity of electrical energy stores and the switched states which are associated with the specified disconnecting electrical switching elements utilizing the at least one integrated electrical circuit by:
(i) combining the digitized measured electrical voltages for the specified multiplicity of electrical energy stores as coordinates in a vector V(t); and
(ii) mapping the digitized measured electrical voltages as an electrical voltage $V_{unit}s(t)$ from the measured respective electrical voltage for the specified multiplicity of electrical energy stores at a respective time (t) as modeled by a matrix M(s(t)) that is a function of the at least two different switched states s(t), such that $V_{unit}(s(t))$=M(s(t)) dot product V(t).

* * * * *